United States Patent
Obika

(10) Patent No.: US 9,069,145 B2
(45) Date of Patent: Jun. 30, 2015

(54) OPTICAL COMMUNICATION MODULE AND METHOD FOR MAKING THE SAME

(71) Applicant: ROHM CO., LTD., Kyoto-shi, Kyoto (JP)

(72) Inventor: Akira Obika, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/047,428

(22) Filed: Oct. 7, 2013

(65) Prior Publication Data

US 2014/0105551 A1    Apr. 17, 2014

(30) Foreign Application Priority Data

Oct. 11, 2012 (JP) ................. 2012-226029

(51) Int. Cl.

| G02B 6/36 | (2006.01) |
|---|---|
| G02B 6/42 | (2006.01) |
| H01L 31/18 | (2006.01) |
| H01L 33/58 | (2010.01) |
| H01L 23/31 | (2006.01) |
| H01L 23/00 | (2006.01) |
| H01S 5/022 | (2006.01) |
| H01L 27/146 | (2006.01) |
| H01L 33/54 | (2010.01) |

(52) U.S. Cl.
CPC .............. *G02B 6/4251* (2013.01); *H01L 31/18* (2013.01); *H01L 33/58* (2013.01); *H01S 5/02252* (2013.01); *H01L 27/14618* (2013.01); *H01L 33/54* (2013.01); *H01L 23/31* (2013.01); *H01L 24/97* (2013.01); *G02B 6/4203* (2013.01); *G02B 6/423* (2013.01)

(58) Field of Classification Search
CPC ........................ G02B 6/4253; H01S 5/02252
USPC ....................... 385/14, 88, 94; 438/27, 65
See application file for complete search history.

(56) References Cited

U.S. PATENT DOCUMENTS

| 4,186,996 | A  * | 2/1980  | Bowen et al. ............ 385/92 |
|---|---|---|---|
| 4,818,059 | A  * | 4/1989  | Kakii et al. ............. 385/65 |
| 6,075,911 | A  * | 6/2000  | Goto ...................... 385/31 |
| 6,425,695 | B1 * | 7/2002  | Murata et al. ........... 385/88 |
| 6,485,197 | B1 * | 11/2002 | Kato ...................... 385/92 |
| 7,775,727 | B2   | 8/2010  | Hamasaki et al. |
| 2002/0057876 | A1 * | 5/2002  | Yamabayashi et al. ..... 385/88 |
| 2003/0059178 | A1 * | 3/2003  | Kobayashi et al. ....... 385/94 |
| 2004/0218872 | A1 * | 11/2004 | Low .................... 385/60 |
| 2004/0223703 | A1 * | 11/2004 | Miyamae et al. ........ 385/88 |
| 2006/0091527 | A1 * | 5/2006  | Tsai et al. ............. 257/706 |

FOREIGN PATENT DOCUMENTS

JP            4406447        11/2009

* cited by examiner

*Primary Examiner* — Peter Radkowski
(74) *Attorney, Agent, or Firm* — Hamre, Schumann, Mueller & Larson, P.C.

(57) ABSTRACT

An optical communication module according to the present invention includes an optical semiconductor element including an optical function region that performs light-receiving function or light-emitting function, a first resin member which covers the optical semiconductor element and is made of a resin that transmits light emitted from the optical function region or light to be received by the optical function region, and a second resin member which covers the first resin member. A portion of the first resin member is exposed from the second resin member. The optical communication module further includes an attachment hole for attaching an optical fiber. The attachment hole includes an opening that opens at the portion of the first resin member which is exposed from the second resin member.

19 Claims, 16 Drawing Sheets

OPTICAL COMMUNICATION MODULE AND METHOD FOR MAKING THE SAME

FIELD OF THE INVENTION

The present invention relates to an optical communication module and a method for making an optical communication module.

DESCRIPTION OF THE RELATED ART

Techniques for transmitting signals by using light as carrier wave are widely used. Optical communication modules are used for these techniques, an example of which is disclosed in Patent Document 1 (Japanese Patent No. 4406447). The optical communication module disclosed in this document includes an optical semiconductor element, which may be a light-emitting element or a light-receiving element. Optical fibers are used for transmitting light from a light-emitting element or transmitting light to a light-receiving element. In the disclosed optical communication module, the optical semiconductor element is attached to an optical fiber holder, with the optical function region of the optical semiconductor element, which performs light-emitting function or light-receiving function, exposed. Optical fibers are attached to the optical fiber holder of the optical communication module in such a manner that the end surfaces of the optical fibers face the optical function region.

In this Patent Document 1, the optical fiber holder is used for properly positioning and fixing the optical fibers with respect to the optical semiconductor element. The optical fiber holder has an opening which is open at the front end and the rear end of the holder. The optical semiconductor element is attached to the front end of the optical fiber holder, with the optical function region facing the opening, so that the optical function region is exposed from the rear end of the optical fiber holder through the opening. The optical fibers are inserted into the opening from the rear end and positioned with respect to the optical function region. In inserting the optical fibers, a resin that transmits light emitted from or to be received by the optical function region is poured into the opening. By this, the optical fibers are fixed, and the gaps between the optical function region and the optical fibers are filled with the resin. The optical fiber holder, which holds the optical fibers and the optical semiconductor element, is mounted on a substrate, along with a component such as a control IC for the optical semiconductor element, whereby the optical communication module is completed.

To protect the component such as a control IC, a cover case or a sealing resin for covering the control IC needs to be provided. To realize a low manufacturing cost and size reduction, the use of a sealing resin is preferable. However, it is difficult to provide a sealing resin so as not to cover the optical fibers. To efficiently manufacture the optical communication module, the components of the optical communication module need to be mounted collectively on a substrate. However, when the space for arranging the optical fibers is secured, it is difficult to mount the components at a high density.

SUMMARY OF THE INVENTION

The present invention has been conceived under the circumstances described above. It is therefore an object of the present invention to provide an optical communication module that can be made efficiently at a low cost and reduced in size, and to provide a method for making such an optical communication module.

According to a first aspect of the present invention, there is provided an optical communication module comprising an optical semiconductor element including an optical function region that performs light-receiving function or light-emitting function, a first resin member which covers the optical semiconductor element and is made of a resin that transmits light emitted from the optical function region or light to be received by the optical function region, and a second resin member covering the first resin member. A portion of the first resin member is exposed from the second resin member. The optical communication module further comprises an attachment hole for attaching an optical fiber. The attachment hole includes an opening that opens at the portion of the first resin member which is exposed from the second resin member.

In a preferred embodiment of the present invention, the attachment hole includes a bottom surface and an inner side surface which are provided by a part of the first resin member.

In a preferred embodiment of the present invention, the bottom surface and the optical function region overlap each other as viewed in the depth direction of the attachment hole.

In a preferred embodiment of the present invention, the optical communication module further comprises a main substrate including an obverse surface and a reverse surface. The obverse surface is in contact with the second resin member. The depth direction of the attachment hole is in parallel with the obverse surface of the main substrate.

In a preferred embodiment of the present invention, the first resin member includes an opening end surface at which the opening of the attachment hole is open. The main substrate includes a substrate end surface that is flush with the opening end surface of the first resin member.

In a preferred embodiment of the present invention, the second resin member includes an end surface that is flush with both of the opening end surface of the first resin member and the substrate end surface of the main substrate.

In a preferred embodiment of the present invention, the optical communication module further comprises a sub-substrate on which the optical semiconductor element is mounted and which stands on the obverse surface of the main substrate.

In a preferred embodiment of the present invention, the depth direction of the attachment hole is perpendicular to the sub-substrate.

In a preferred embodiment of the present invention, the first resin member is in contact with the obverse surface of the main substrate.

In a preferred embodiment of the present invention, the sub-substrate is in the form of a rectangle having four side surfaces. The first resin member includes four side surfaces that are flush with the four side surfaces of the sub-substrate, respectively.

In a preferred embodiment of the present invention, the reverse surface of the main substrate is a mount surface for surface-mounting.

In a preferred embodiment of the present invention, the optical communication module further comprises a control IC mounted on the obverse surface of the main substrate.

In a preferred embodiment of the present invention, the cross sectional dimension of the attachment hole increases as proceeding toward the opening in the depth direction.

In a preferred embodiment of the present invention, the second resin member is made of opaque resin.

According to a second aspect of the present invention, there is provided a method for making an optical communication module. The method comprises the steps of: forming a first resin intermediate product by covering an optical semiconductor element with a resin, the optical semiconductor element including an optical function region that performs light-receiving function or light-emitting function, the resin transmitting light emitted from the optical function region or light to be received by the optical function region; forming a preliminary hole in the first resin intermediate product; attaching a sealing sheet to the first resin intermediate product to close the preliminary hole; forming a second resin intermediate product by covering the first resin intermediate product and the sealing sheet with a resin; and forming a first resin member, a second resin member and an attachment hole by collectively removing the sealing sheet, a part of the first resin intermediate product and a part of the second resin intermediate product, the first resin member covering the optical semiconductor element, the second resin member exposing a portion of the first resin member while covering remaining portions of the first resin member, the attachment hole including an opening that opens at the portion of the first resin member which is exposed from the second resin member.

In a preferred embodiment of the present invention, the step of forming a preliminary hole uses a drill and comprises moving the drill from outside of the first resin intermediate member toward the optical function region of the semiconductor element.

In a preferred embodiment of the present invention, the step of forming a first resin member, a second resin member and an attachment hole comprises collectively cutting the first and the second resin intermediate products and the preliminary hole.

In a preferred embodiment of the present invention, the sealing sheet is made of a metal.

In a preferred embodiment of the present invention, the sealing sheet is made of resin.

In a preferred embodiment of the present invention, the second resin member and the second resin intermediate product are made of opaque resin.

Other features and advantages of the present invention will become clearer from the detailed description given below with reference to the accompanying drawings.

DESCRIPTION OF THE PREFERRED EMBODIMENTS

Preferred embodiments of the present invention are described below with reference to the accompanying drawings.

Figure 1:
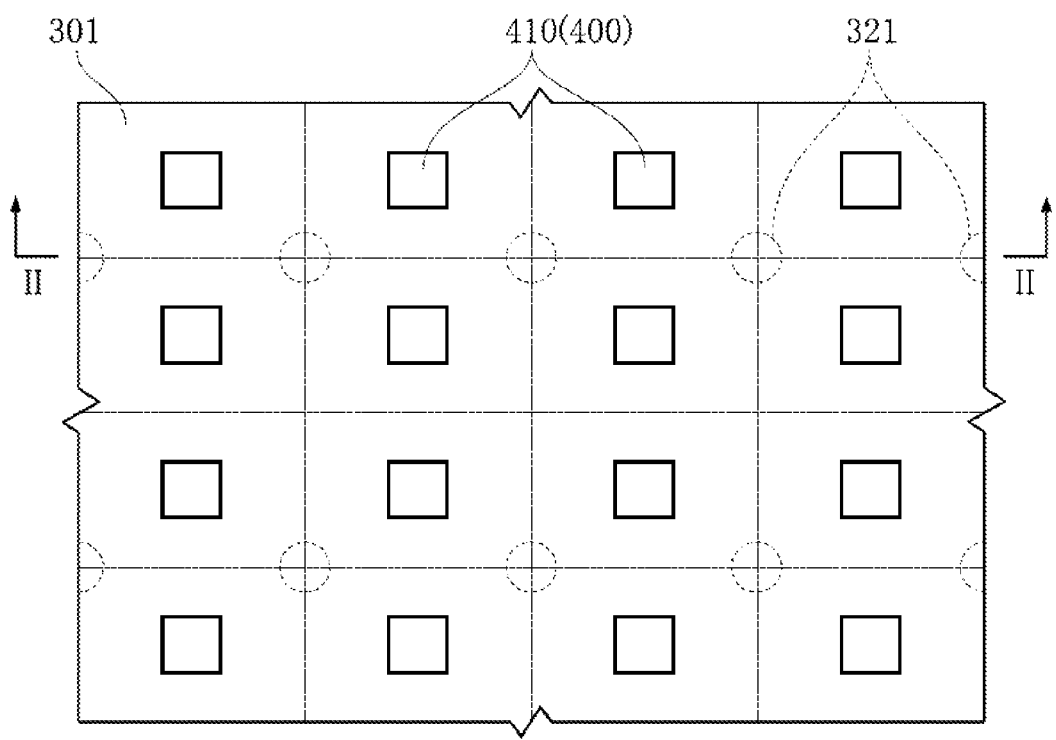
FIG. 1 is a schematic plan view showing a method for making an optical communication module according to a first embodiment of the present invention.
Figure 2:
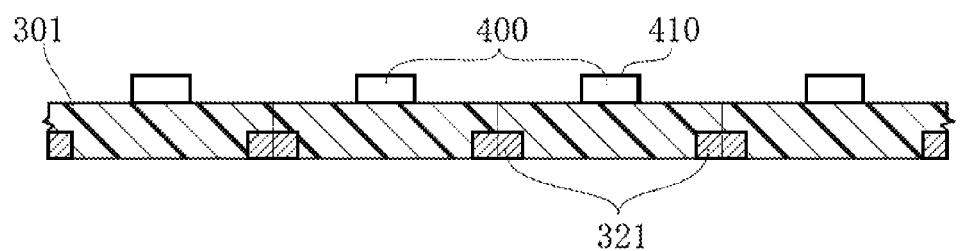
FIG. 2 is a schematic sectional view taken along lines II-II in FIG. 1.

FIGS. 1-11 show a method for making an optical communication module according to a first embodiment of the present invention. First, as shown in FIGS. 1 and 2, a sub-substrate material 301 is prepared. The sub-substrate material 301 includes a base made of e.g. glass epoxy resin or BT (Bismaleimide-Triazine) resin and wiring patterns (not shown) formed on the upper and the lower surfaces of the base. The sub-substrate material 301 further includes a plurality of through-holes 321. The through-holes 321 are electrically connected to the wiring patterns.

Then, a plurality of optical semiconductor elements 400 are mounted on the sub-substrate material 301. Each of the optical semiconductor elements 400 has an optical function region 410 that performs light-emitting function or light-receiving function. Examples of the optical semiconductor element 400 in which the optical function region 410 performs light-emitting function include an LED and a VCSEL (Vertical Cavity Surface Emitting LASER). When the optical semiconductor elements 400 are LEDs or VCSELs, the optical function regions 410 are on the upper surfaces of the optical semiconductor elements 400 in FIG. 2. Examples of the optical semiconductor element 400 in which the optical function region 410 performs light-receiving function include a photodiode. When the optical semiconductor elements 400 are photodiodes, the optical function regions 410 are on the upper surfaces of the optical semiconductor elements 400 in FIG. 2.

In mounting the optical semiconductor elements 400 on the sub-substrate material 301, the optical semiconductor elements may be die-bonded on the wiring pattern by using electrically conductive bonding paste or connected to the wiring pattern with wires.

Figure 3:
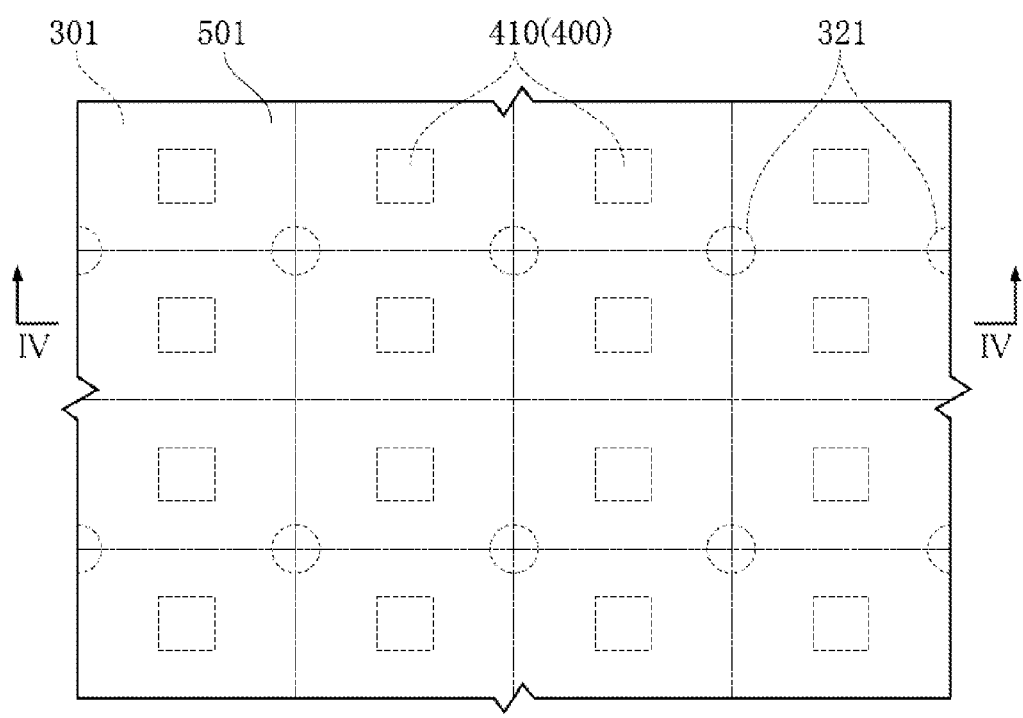
FIG. 3 is a schematic plan view showing the method for making the optical communication module according to the first embodiment of the present invention.
Figure 4:
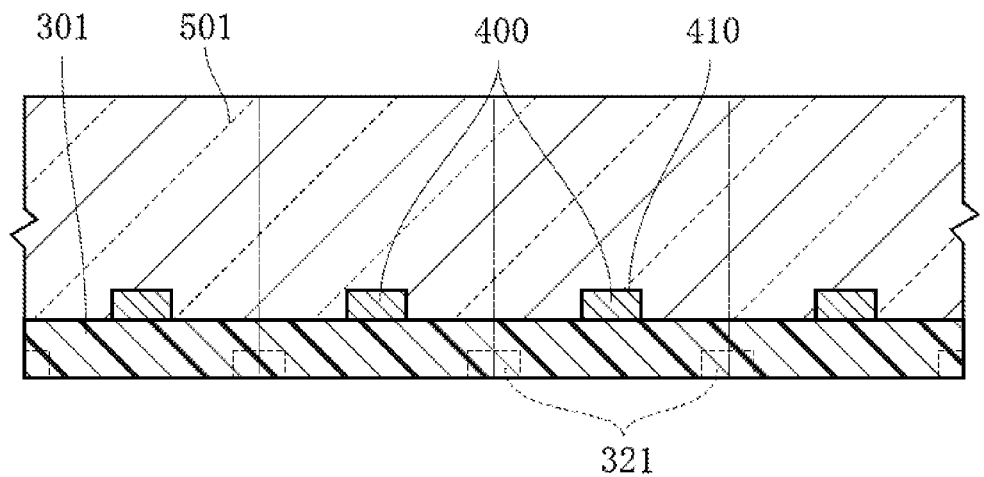
FIG. 4 is a schematic sectional view taken along lines IV-IV in FIG. 3.

Subsequently, a transparent resin material is applied onto the sub-substrate material 301 to cover the optical semiconductor elements 400 and then hardened. As a result, as shown in FIGS. 3 and 4, a first resin intermediate product 501 is obtained. The first resin intermediate product 501 covers the substantially entire surface of the sub-substrate material 301 and all of the optical semiconductor elements 400. Examples of the material for the first resin intermediate product 501 include transparent epoxy resin. Note that, as the material for the first resin intermediate product 501, an appropriate resin that transmits light emitted from the optical function regions 401 or light to be received by the optical function regions 401 is selected. For instance, when the optical function regions 401 are to receive or emit infrared light, a black resin that transmits infrared light may be used as the material for the first resin intermediate product 501.

Figure 5:
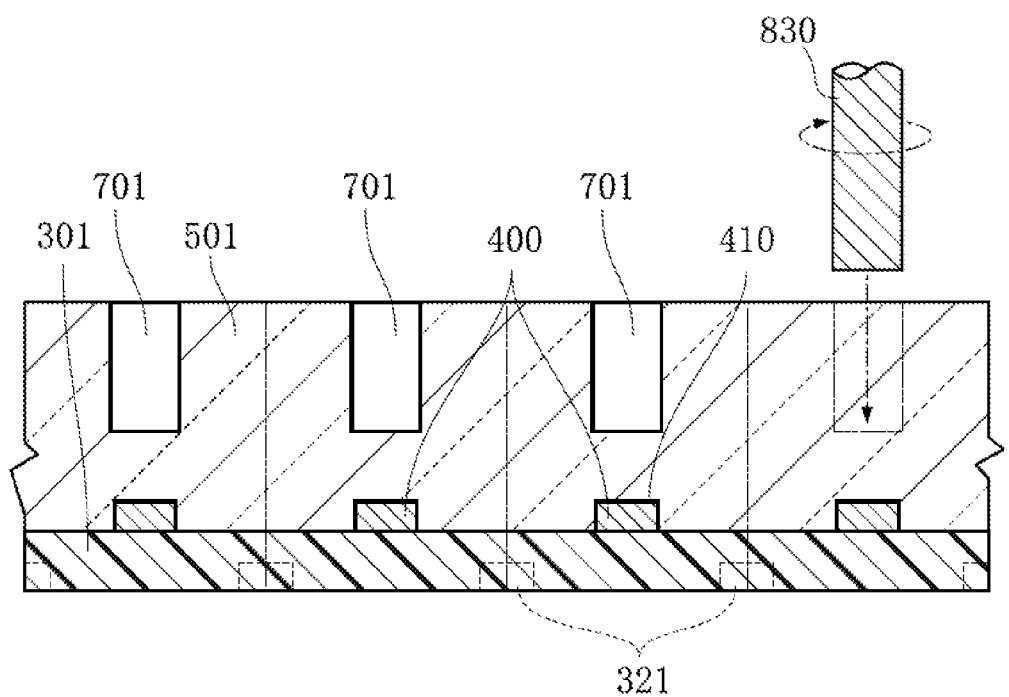
FIG. 5 is a schematic sectional view showing the method for making the optical communication module according to the first embodiment of the present invention.
Figure 6:
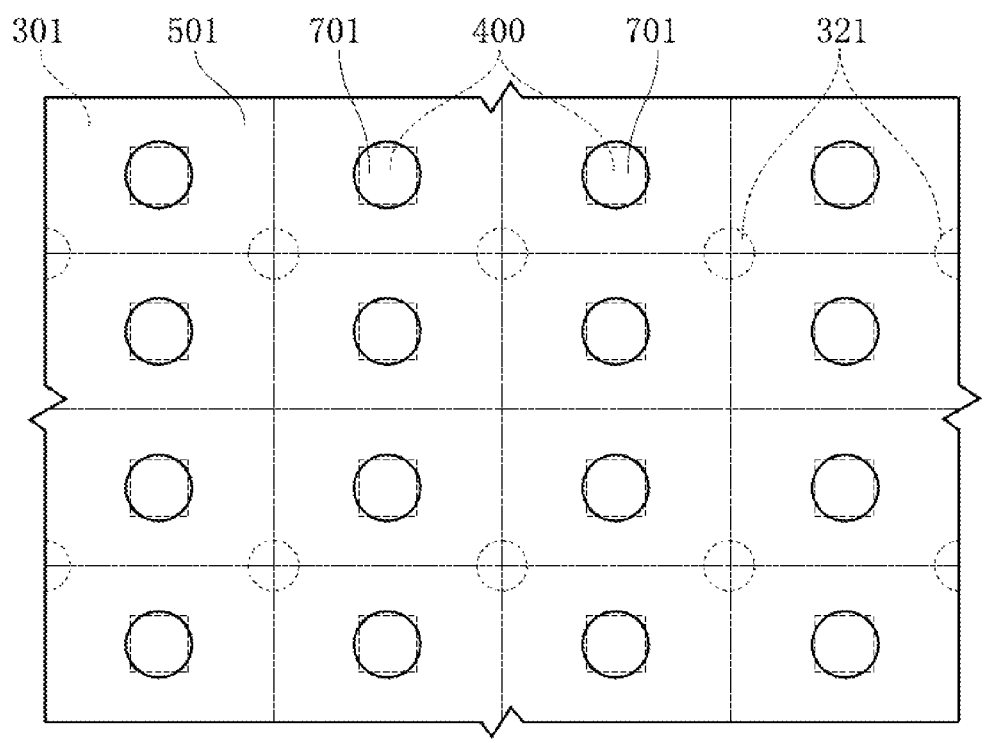
FIG. 6 is a schematic plan view showing the method for making the optical communication module according to the first embodiment of the present invention.

Then, as shown in FIGS. 5 and 6, preliminary holes 701 are formed. The formation of the preliminary holes 701 is performed by e.g. cutting using a drill 830. Since the first resin intermediate product 501 is transparent, the position of the optical function region 410 of each optical semiconductor element can be determined by e.g. image processing. Then, the rotating drill 830 is moved from the outside of the first resin intermediate product 501 toward the optical function region 410. A preliminary hole 701 is formed by inserting the drill 830 to a predetermined depth in the first resin intermediate product 501. This cutting process is performed with respect to each of the optical semiconductor elements 400. Each preliminary hole 701 and a corresponding one of the optical function region 410 overlap each other as viewed in the thickness direction of the sub-substrate material 301.

Figure 7:
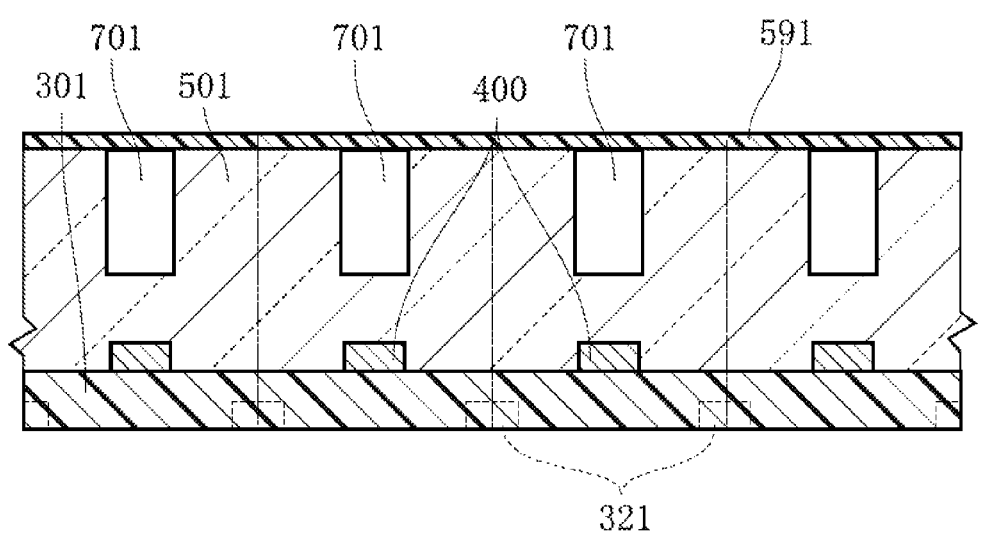
FIG. 7 is a schematic sectional view showing the method for making the optical communication module according to the first embodiment of the present invention.

Then, as shown in FIG. 7, a sealing sheet 591 is attached. The sealing sheet 591 is made of resin such as polyimide resin or a metal and bonded to the first resin intermediate product 501 with e.g. an adhesive (not shown) so as to close the preliminary holes 701.

Figure 8:
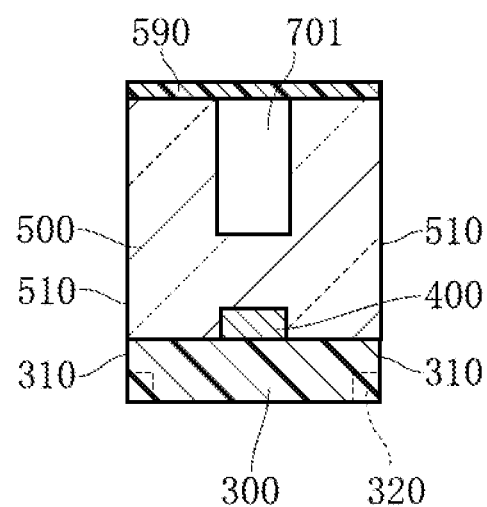
FIG. 8 is a sectional view showing the state after the sub-substrate material is cut in the method for making the optical communication module according to the first embodiment of the present invention.

Then, the sub-substrate material 301 is cut along the imaginary lines shown in FIG. 7, whereby a plurality of intermediate products as shown in FIG. 8 are obtained. By cutting the sub-substrate material 301, the sub-substrate 300 is formed. By cutting the first resin intermediate product 501, the first resin member 500 is formed. The sub-substrate 300 is in the form of a rectangular plate having four side surfaces 310. The first resin member 500 has four side surfaces 510. Each of the four side surfaces 310 is flush with a respective one of the four side surfaces 510. The sub-substrate 300 is provided with an electrode 320, which is obtained by cutting the through-hole 321. By cutting the sealing sheet 591, the sealing sheet 590 is formed. The shape of the sealing sheet 590 as viewed in the thickness direction of the sub-substrate 300 is the same as that of the first resin member 500. The sealing sheet 590 closes the preliminary hole 701.

Figure 9:
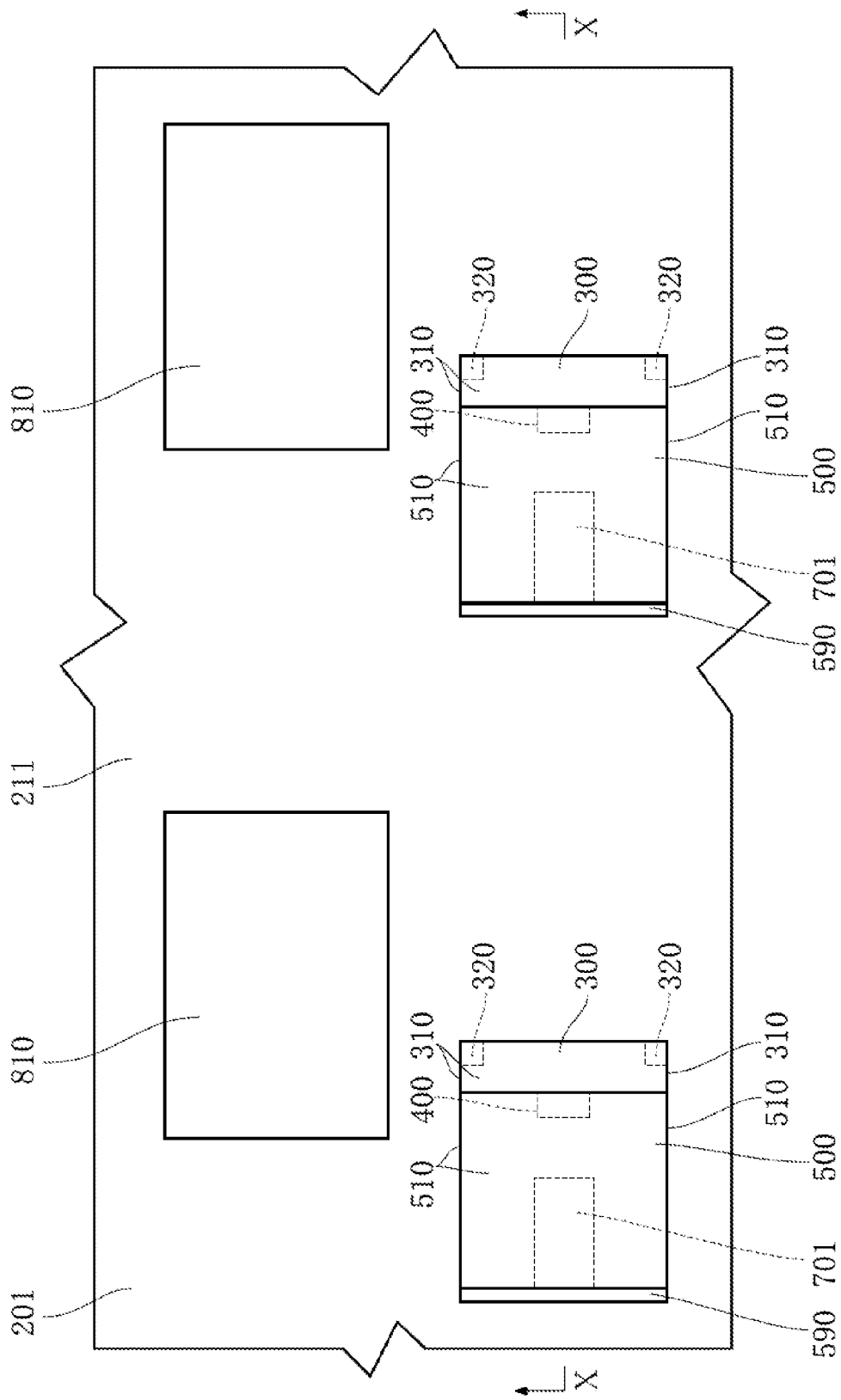
FIG. 9 is a schematic plan view showing the method for making the optical communication module according to the first embodiment of the present invention.
Figure 10:
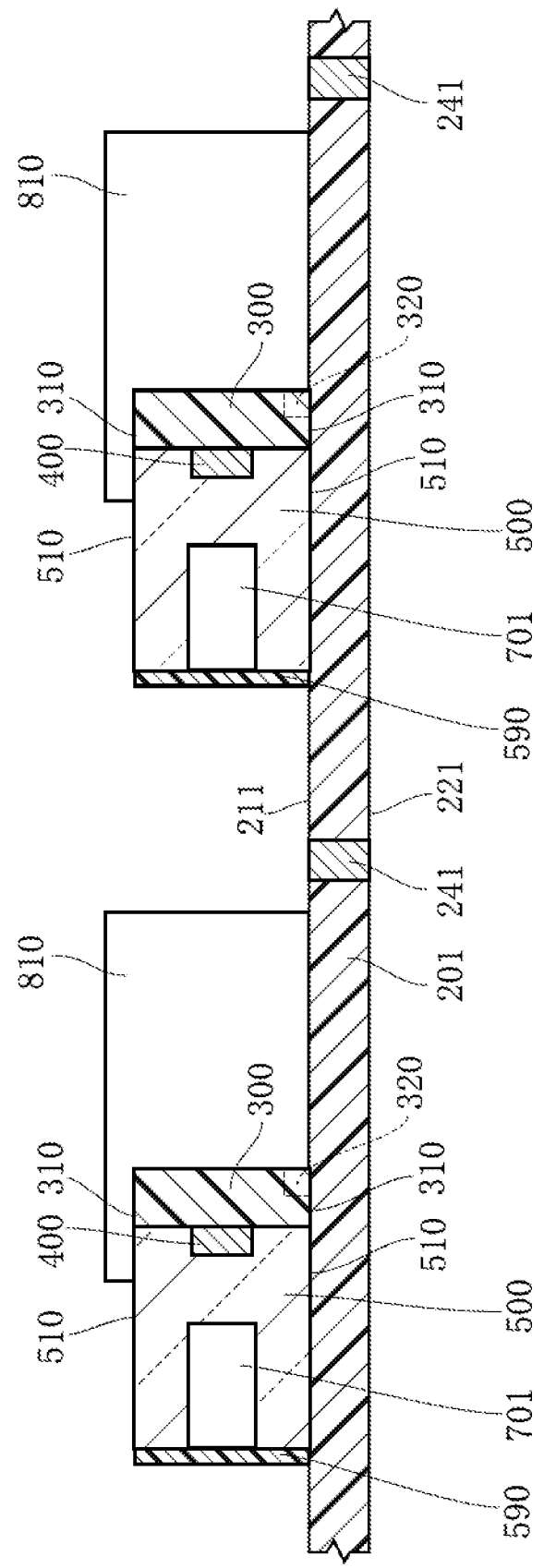
FIG. 10 is a schematic sectional view taken along lines X-X in FIG. 9.

Then, as shown in FIGS. 9 and 10, the intermediate products shown in FIG. 8 are mounted to a main substrate material 201. Similarly to the sub-substrate material 301, the main substrate material 201 includes a base made of e.g. glass epoxy resin and wiring patterns (not shown) formed on the upper and the lower surface of the base. The main substrate material 201 has an obverse surface 211 and a reverse surface 221. The main substrate material 201 further includes a plurality of through-holes 241. The through-holes 241 are electrically connected to the wiring patterns. Note that illustration of the through-holes 241 is omitted in FIG. 9. The intermediate products are surface-mounted to the main substrate material 201 by using e.g. solder paste or electrically conductive paste. Thus, the electrodes 320 of the intermediate products are electrically connected to the above-described wiring patterns and through-holes 421 of the main substrate material 201. As shown in FIGS. 9 and 10, each of the intermediate products is mounted on the main substrate material 201 in such a manner that one of the side surfaces 510 and a corresponding one of the side surfaces 310 are on the obverse surface 211. Thus, the depth direction of the preliminary holes 701 is in parallel with the obverse surface 211.

A plurality of control ICs 810 are also mounted on the obverse surface 211 of the main substrate material 201. The control ICs 810 function to control the optical semiconductor elements 400 and are electrically connected to the above-described wiring patterns of the main substrate material 201 by a plurality of non-illustrated wires.

Figure 11:
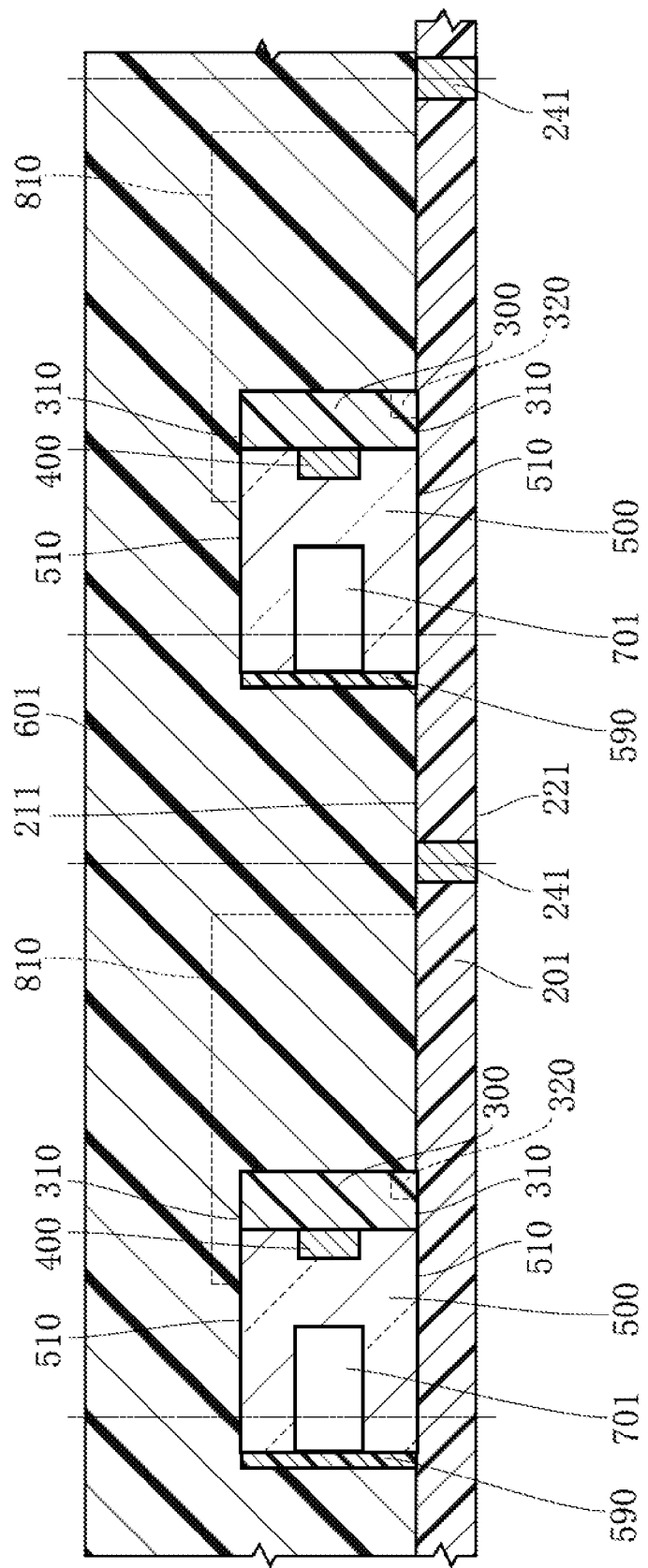
FIG. 11 is a schematic sectional view showing the method for making the optical communication module according to the first embodiment of the present invention.

Subsequently, an opaque resin material is applied onto the obverse surface 211 of the main substrate material 201 to cover the intermediate products and then hardened. As a result, as shown in FIG. 11, a second resin intermediate product 601 is obtained. The second resin intermediate product 601 covers the substantially entire surface of the main substrate material 201 and all of the above-described intermediate products. Examples of the material for the second resin intermediate product 601 include opaque epoxy resin in which a filler for adjusting the properties is mixed.

Figure 12:
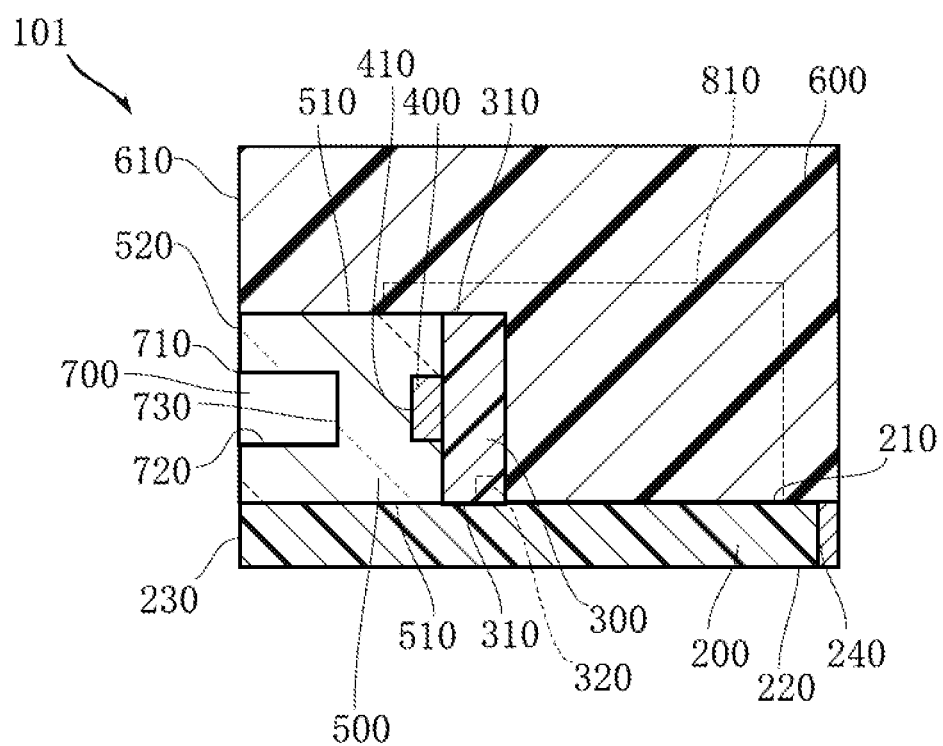
FIG. 12 is a sectional view of the optical communication module according to the first embodiment of the present invention.
Figure 13:
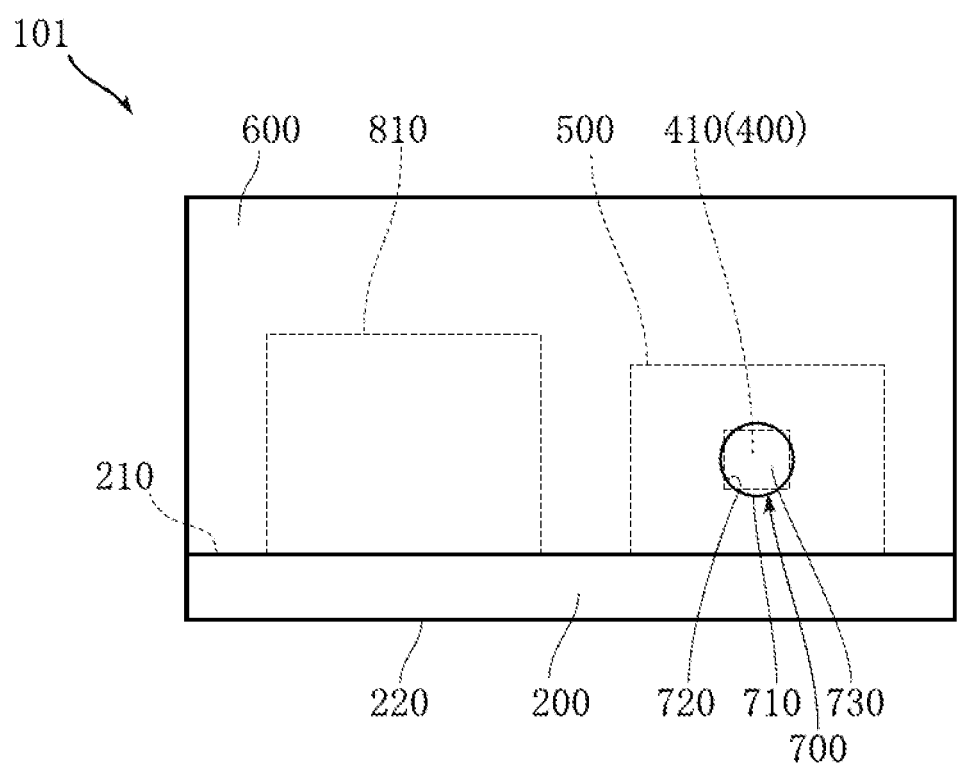
FIG. 13 is a front view of the optical communication module of FIG. 12.
Figure 14:
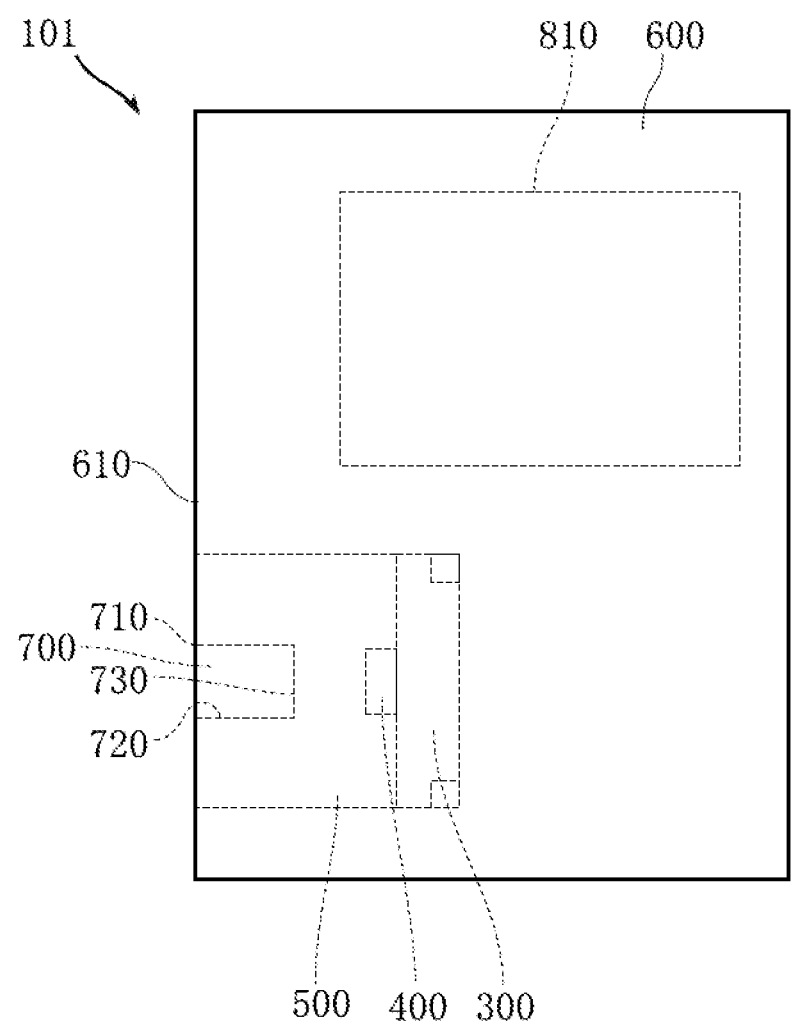
FIG. 14 is a plan view of the optical communication module of FIG. 12.

Then, the main substrate material 201 is cut along the imaginary lines shown in FIG. 11. These imaginary lines are set in such a manner that the main substrate material 201 is divided into a plurality of pieces that are rectangular as viewed in plan. Some of the cut surfaces cross the preliminary holes 701. By this cutting, the preliminary holes 701 are cut, and the sealing sheets 590 are removed. Thus, the optical communication module 101 shown in FIGS. 12-14 is obtained.

As will be understood from the manufacturing method described above, the optical communication module 101 includes the main substrate 200, the sub-substrate 300, the optical semiconductor element 400, the first resin member 500, the second resin member 600, the attachment hole 700 and the control IC 810.

The main substrate 200 is rectangular and obtained by cutting the main substrate material 201 into rectangular pieces. The main substrate 200 has an electrode 240, which is formed by cutting the through-hole 241. The main substrate 200 also includes an end surface 230.

The first resin member 500 includes an opening end surface 520 exposed from the second resin member 600. The opening end surface 520 is flush with the end surface 610 of the second resin member 600. The opening end surface 520 is also flush with the end surface 230 of the main substrate 200.

The attachment hole 700 is provided as a result of cutting the preliminary hole 701 and includes an opening 710, an inner side surface 720 and a bottom surface 730. The opening 710 is open in the opening end surface 520 of the first resin member 500 and circular in this embodiment. The inner side surface 720 is provided by the first resin member 500. The bottom surface 730 is circular and provided by the first resin member 500.

As shown in FIG. 13, as viewed in the depth direction of the attachment hole 700, the opening 710 and the bottom surface 730 overlap the optical function region 410 of the optical semiconductor element 400. The depth direction of the attachment hole 700 is in parallel with the obverse surface 210 of the main substrate 200 and perpendicular to the sub-substrate 300. The sub-substrate 300 stands on the obverse surface 210 of the main substrate 200.

The attachment hole 700 is used for attaching an optical fiber for transmitting light from the optical function region 410 of the optical semiconductor element 400 or transmitting light to the optical function region 410. Specifically, the optical fiber is fixed in the attachment hole 700, with an end surface of the optical fiber facing the bottom surface 730. For the fixation of the optical fiber, various methods can be employed such as clamping or bonding the optical fiber to an appropriate portion.

The advantages of the optical communication module 101 and the method for making the module are described below.

According to this embodiment, the optical fiber can be fixed by using the attachment hole 700. The first resin member 500, which constitutes the attachment hole 700, also functions to seal the optical semiconductor element 400. Thus, the structure is advantages as compared with a structure in which a mechanism for positioning and fixing an optical fiber is separately provided. Thus, the optical communication module 101 can be manufactured efficiently and reduced in size.

The attachment hole 700 that has the inner side surface 720 and the bottom surface 730 is suitable for attaching an optical fiber which is generally circular in cross section. Since the bottom surface 730 and the optical function region 410 of the optical semiconductor element 400 overlap each other as viewed in the depth direction of the attachment hole 700, light from the optical function region 410 of the optical semiconductor element 400 having light-emitting function is reliably guided to the optical fiber, or light from the optical fiber is reliably guided to the optical function region 410 of the optical semiconductor element 400 having light-receiving function.

By forming the preliminary holes 701 in the first resin intermediate product 501 perpendicularly to the sub-substrate material 301 and bonding the sub-substrate 300 to the main substrate material 201 with the side surface 510 of the first resin member 500 lying on the obverse surface 211 of the main substrate material 201, the depth direction of the attachment hole 700 becomes parallel with the obverse surface 210 of the main substrate 200.

Since the first resin intermediate product 501 is made of transparent resin, the position of each optical semiconductor element 400 can be precisely determined in forming the preliminary holes 701. Thus, each preliminary hole 701 can be formed so that its bottom surface overlaps the optical function region 410 as viewed in the thickness direction. This assures that, in the optical communication module 101, the bottom surface 730 and the optical function region 410 reliably overlap each other as viewed in the depth direction of the attachment hole 700.

The second resin member 600 is made of an opaque resin material. This makes it possible to block part of unnecessary external light that does not travel through the attachment hole 700.

Figure 15:
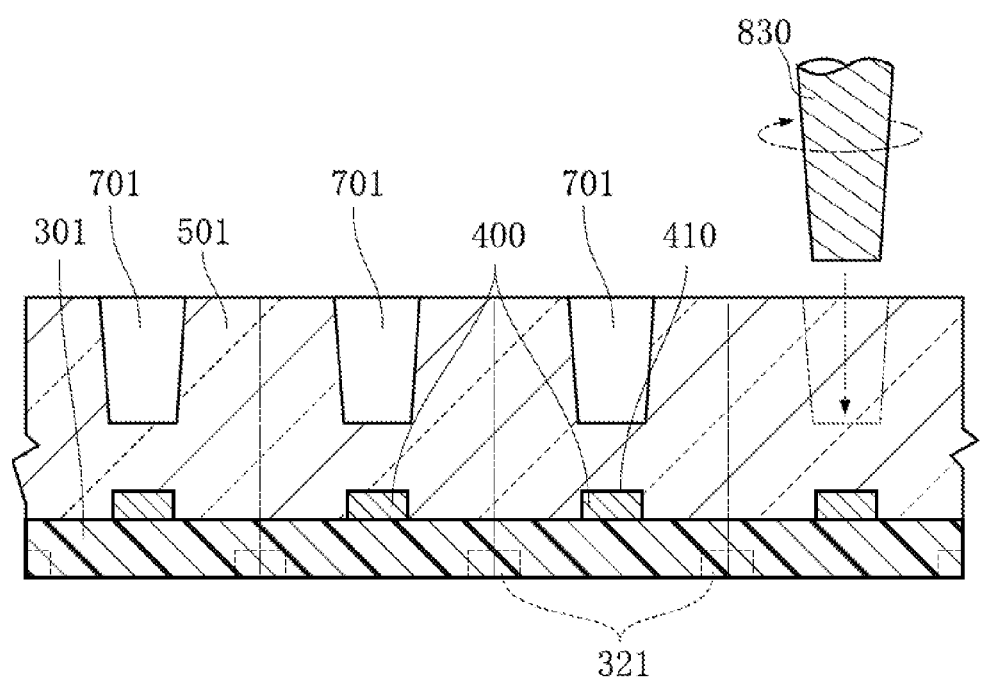
FIG. 15 is a schematic sectional view showing a method for making an optical communication module according to a second embodiment of the present invention.
Figure 16:
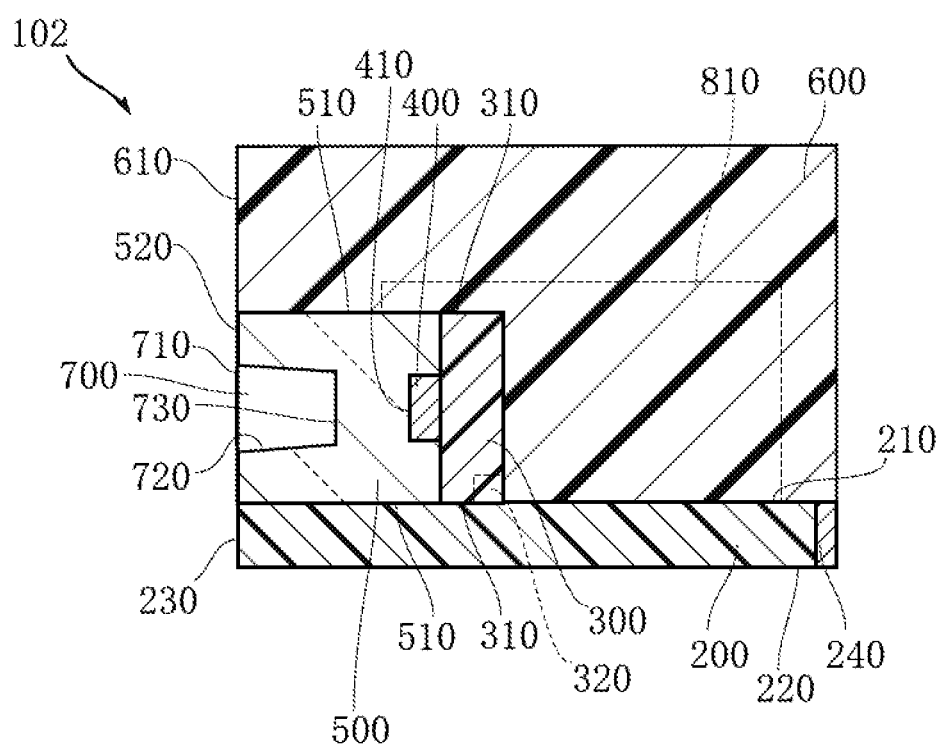
FIG. 16 is a sectional view showing an optical communication module according to a second embodiment of the present invention.

FIGS. 15-16 show other embodiments of the present invention. In these figures, the elements that are identical or similar to those of the foregoing embodiment are designated by the same reference signs as those used for the foregoing embodiment.

FIG. 15 shows a method for making an optical communication module according to a second embodiment of the present invention. In this embodiment, after the steps described with reference to FIGS. 1-4 are performed, preliminary holes 701 are formed by using the drill 830 shown in FIG. 15. The cross sectional dimension of the drill 830 reduces as proceeding toward the end. Thus, the cross sectional dimension of each preliminary hole 701 reduces as proceeding from the opening toward the bottom surface.

Thereafter, the same steps as those described with reference to FIGS. 7-11 are performed, whereby the optical communication module 102 shown in FIG. 16 is obtained.

In the optical communication module 102, the cross sectional dimension of the attachment hole 700 increases as proceeding from the bottom surface 730 toward the opening 710, because the attachment hole 700 is formed by cutting the preliminary hole 701.

According to this embodiment again, the optical communication module 102 can be manufactured efficiently and reduced in size. Further, according to this embodiment, in inserting an optical fiber into the attachment hole 700, the inner side surface 720 functions to center the optical fiber. Thus, the optical fiber is reliably positioned with respect to the optical function region 410 of the optical semiconductor element 400.

The optical communication module and the method for making the module according to the present invention are not limited to the foregoing embodiments. The specific structure of the optical communication module and the method for making the module can be varied in design in many ways.

The invention claimed is:

1. An optical communication module comprising:
an optical semiconductor element including an optical function region that performs light-receiving function or light-emitting function;
a first resin member covering the optical semiconductor element, the first resin member being made of a resin that transmits light emitted from the optical function region or light to be received by the optical function region;
a second resin member covering the first resin member; and
a main substrate comprising an obverse surface and a reverse surface, the obverse surface being in contact with the second resin member;
wherein
the optical communication module further comprises an attachment hole for attaching an optical fiber, the attachment hole including an opening that opens at a portion of the first resin member which is exposed from the second resin member,
the first resin member comprises an opening end surface at which the opening of the attachment hole is open, and
the main substrate comprises a substrate end surface that is flush with the opening end surface of the resin member.

2. The optical communication module according to claim 1, wherein the attachment hole includes a bottom surface and an inner side surface which are provided by a part of the first resin member.

3. The optical communication module according to claim 2, wherein the bottom surface and the optical function region overlap each other as viewed in a depth direction of the attachment hole.

4. The optical communication module according to claim 2, wherein a depth direction of the attachment hole is in parallel with the obverse surface of the main substrate.

5. The optical communication module according to claim 1, wherein the second resin member includes an end surface that is flush with both of the opening end surface of the first resin member and the substrate end surface of the main substrate.

6. The optical communication module according to claim 4, further comprising a sub-substrate on which the optical semiconductor element is mounted, the sub-substrate standing on the obverse surface of the main substrate.

7. The optical communication module according to claim 6, wherein the depth direction of the attachment hole is perpendicular to the sub-substrate.

8. The optical communication module according to claim 7, wherein the first resin member is in contact with the obverse surface of the main substrate.

9. The optical communication module according to claim 8, wherein the sub-substrate is in a form of a rectangle having four side surfaces, and
the first resin member includes four side surfaces that are flush with the four side surfaces of the sub-substrate, respectively.

10. The optical communication module according to claim 4, wherein the reverse surface of the main substrate is a mount surface for surface-mounting.

11. The optical communication module according to claim 4, further comprising a control IC mounted on the obverse surface of the main substrate.

12. The optical communication module according to claim 1, wherein a cross sectional dimension of the attachment hole increases as proceeding toward the opening in a depth direction.

13. The optical communication module according to claim 1, wherein the second resin member is made of opaque resin.

14. A method for making an optical communication module, the method comprising the steps of:
- forming a first resin intermediate product by covering an optical semiconductor element with a resin, the optical semiconductor element including an optical function region that performs light-receiving function or light-emitting function, the resin transmitting light emitted from the optical function region or light to be received by the optical function region;
- forming a preliminary hole in the first resin intermediate product;
- attaching a sealing sheet to the first resin intermediate product to close the preliminary hole;
- forming a second resin intermediate product by covering the first resin intermediate product and the sealing sheet with a resin; and
- forming a first resin member, a second resin member and an attachment hole by collectively removing the sealing sheet, a part of the first resin intermediate product and a part of the second resin intermediate product, the first resin member covering the optical semiconductor element, the second resin member exposing a portion of the first resin member while covering remaining portions of the first resin member, the attachment hole including an opening that opens at the portion of the first resin member which is exposed from the second resin member.

15. The method for making an optical communication module according to claim 14, wherein the step of forming a preliminary hole uses a drill and comprises moving the drill from outside of the first resin intermediate member toward the optical function region of the semiconductor element.

16. The method for making an optical communication module according to claim 14, wherein the step of forming a first resin member, a second resin member and an attachment hole comprises collectively cutting the first and the second resin intermediate products and the preliminary hole.

17. The method for making an optical communication module according to claim 14, wherein the sealing sheet is made of a metal.

18. The method for making an optical communication module according to claim 14, wherein the sealing sheet is made of resin.

19. The method for making an optical communication module according to claim 14, wherein the second resin member and the second resin intermediate product are made of opaque resin.

* * * * *